US012568162B2

(12) United States Patent
Ren et al.

(10) Patent No.: US 12,568,162 B2
(45) Date of Patent: Mar. 3, 2026

(54) OLED DISPLAY APPARATUS, PREPARATION METHOD THEREOF, AND DISPLAY TERMINAL

(71) Applicant: HONOR DEVICE CO., LTD., Shenzhen (CN)

(72) Inventors: Baogang Ren, Shenzhen (CN); Kai Liu, Shenzhen (CN); Pan Wu, Shenzhen (CN); Ren Liu, Shenzhen (CN)

(73) Assignee: HONOR DEVICE CO., LTD., Shenzhen (CN)

( * ) Notice: Subject to any disclaimer, the term of this patent is extended or adjusted under 35 U.S.C. 154(b) by 683 days.

(21) Appl. No.: 17/797,875

(22) PCT Filed: Mar. 30, 2022

(86) PCT No.: PCT/CN2022/084108
§ 371 (c)(1),
(2) Date: Aug. 5, 2022

(87) PCT Pub. No.: WO2022/242329
PCT Pub. Date: Nov. 24, 2022

(65) Prior Publication Data
US 2024/0206282 A1 Jun. 20, 2024

(30) Foreign Application Priority Data

May 17, 2021 (CN) .......................... 202110535019.6

(51) Int. Cl.
*H10K 59/80* (2023.01)
*H04M 1/02* (2006.01)
*H10K 71/50* (2023.01)

(52) U.S. Cl.
CPC ........ *H04M 1/0266* (2013.01); *H10K 59/872* (2023.02); *H10K 71/50* (2023.02); *H10K 59/871* (2023.02); *H10K 59/8722* (2023.02)

(58) Field of Classification Search
None
See application file for complete search history.

(56) References Cited

U.S. PATENT DOCUMENTS 9,237,299 B2 1/2016 Yoon et al.
10,567,563 B2 * 2/2020 Qian .................... H04M 1/0283
(Continued)

FOREIGN PATENT DOCUMENTS

CN 203217514 U 9/2013
CN 108153023 A 6/2018
(Continued)

*Primary Examiner* — Long Pham
(74) *Attorney, Agent, or Firm* — WOMBLE BOND DICKINSON (US) LLP

(57) ABSTRACT

An OLED display apparatus is provided, which includes a middle frame and an OLED screen. The middle frame includes a support structure for supporting the OLED screen. The OLED screen includes a super clean foam, a display layer, and a packaging cover plate. The super clean foam is adhered to a bottom plate of the middle frame by using an adhesive. The OLED screen is provided with a side sealant at least in a portion corresponding to a head area, and the side sealant is adhered to a side end surface of the super clean foam, a side end surface of the display layer, and a surface of the packaging cover plate and facing the bottom plate. The OLED screen is adhered to the support structure by using a seam sealant. A transition connecting adhesive connects the side sealant and the seam sealant.

12 Claims, 4 Drawing Sheets

100

(56)     References Cited

U.S. PATENT DOCUMENTS

| | | | |
|---|---|---|---|
| 11,194,184 B2 | 12/2021 | Zhang et al. | |
| 2018/0329254 A1 | 11/2018 | Wang et al. | |
| 2019/0335029 A1 | 10/2019 | Qian | |
| 2020/0249517 A1* | 8/2020 | Bai ..................... | H04M 1/0266 |
| 2020/0374379 A1 | 11/2020 | Guo et al. | |
| 2021/0294137 A1 | 9/2021 | Pan et al. | |

FOREIGN PATENT DOCUMENTS

| | | |
|---|---|---|
| CN | 108319336 A | 7/2018 |
| CN | 207853955 U | 9/2018 |
| CN | 208940012 U | 6/2019 |
| CN | 110196621 A | 9/2019 |
| CN | 110286531 A | 9/2019 |
| CN | 111770224 A | 10/2020 |
| CN | 113891586 A | 1/2022 |
| CN | 216451610 U | 5/2022 |
| GB | 2486765 A | 6/2012 |
| JP | 2008083263 A | 4/2008 |
| WO | 2018120418 A1 | 7/2018 |

* cited by examiner

001

C'

03

01

02

04

001

04

01

S'

02

03

100

OLED DISPLAY APPARATUS, PREPARATION METHOD THEREOF, AND DISPLAY TERMINAL

CROSS-REFERENCE TO RELATED APPLICATIONS

This application is a national stage of International Application No. PCT/CN2022/084108, filed on Mar. 30, 2022, which claims priority to Chinese Patent Application No. 202110535019.6, filed with the China National Intellectual Property Administration on May 17, 2021. Both of the aforementioned applications are hereby incorporated by reference in their entireties.

TECHNICAL FIELD

This application relates to the field of display technologies, and in particular, to an OLED display apparatus, a preparation method thereof, and a display terminal.

BACKGROUND

With rapid development and popularization of terminal devices such as smartphones, consumer requirements for the terminal devices such as mobile phones are no longer limited to a call function, and consumers have increasingly higher beauty requirements. For example, an OLED (organic light emitting diode, organic light emitting diode) screen used by an OLED display apparatus such as a mobile phone has black edges around the OLED screen, which seriously affects beauty of the OLED display apparatus. Based on this, reducing sizes of the black edges around the OLED screen is more important.

However, blindly reducing the sizes of the black edges around the OLED screen causes poor sealing of the OLED screen, and liquid entering of the OLED screen causes serious failure of a function.

Therefore, how to ensure waterproof sealing of the OLED screen while reducing the sizes of the black edges around the OLED screen is an urgent problem to be resolved.

SUMMARY

This application provides an OLED display apparatus, a preparation method thereof, and a display terminal, to ensure waterproof sealing of an OLED screen while reducing sizes of black edges around the OLED screen.

According to a first aspect, this application provides an OLED (organic light emitting diode, organic light emitting diode) display apparatus. The OLED display apparatus may be divided into a head area and a tail area, and the head area has two corners. With reference to a structure of the OLED display apparatus, specifically, the OLED display apparatus includes a middle frame and an OLED screen. The middle frame includes a bottom plate and a side plate disposed on a side of the bottom plate, the side plate in the middle frame is provided with a support structure in at least the tail area, and the support structure is configured to support the OLED screen. The OLED screen includes a super clean foam (super clean foam, SCF), a display layer, and a packaging cover plate that are disposed in a stacked manner. The packaging cover plate partially exceeds beyond the display layer and the super clean foam along an extending direction of the OLED screen, to provide protection against the display layer and the super clean foam. The super clean foam serves as a buffer for the OLED screen. When the middle frame and the OLED screen are connected, a side sealant is formed in the OLED screen in at least a portion corresponding to the head area, so that the side sealant is adhered to a side end surface of the super clean foam, a side end surface of the display layer, and a surface that is of the packaging cover plate and that faces the bottom plate, to seal a side end surface of the OLED screen. The OLED screen is adhered to the middle frame by using a seam adhesive on the support structure, and the OLED screen is sealed and fastened. In addition, a transition connecting adhesive is formed in each corner in the head area, so that the transition connecting adhesive connects the seam sealant and the side sealant to form a complete sealing structure on a peripheral side of the OLED screen.

Because the OLED display apparatus provided in this application uses the side sealant, the seam sealant, and the transition connecting adhesive to perform waterproof sealing, the support structure corresponding to the OLED screen can be canceled on the side plate in the middle frame, so that sizes of black edges around the OLED screen can be effectively reduced, and overall beauty of the apparatus can be improved. In addition, the OLED display apparatus provided in this application performs waterproof sealing of the whole apparatus by using the side sealant, the seam sealant, and the transition connecting adhesive, so that waterproof performance of the whole apparatus can be ensured and improved.

When a structure of the transition connecting adhesive is specifically disposed, the transition connecting adhesive may be disposed to include a dam structure and a dispensing adhesive, the dam structure specifically includes a first dam and a second dam, and there is a gap between the second dam and the first dam. Specifically, the first dam connects the side sealant, the seam sealant, and the adhesive. The second dam is disposed on one side that is of the first dam and that is close to the tail area, and the second dam connects the seam sealant and the adhesive. The dispensing glue is filled in the gap. It should be noted that, to facilitate filling the dispensing glue in the gap, a glue dispensing hole for filling the dispensing glue may be disposed in a portion of the bottom plate corresponding to the gap. It should be understood that, during specific disposing, a transition connecting adhesive on only one corner may be set as the foregoing structure, or transition connecting adhesives on the two corners may be set as the foregoing structure. The transition connecting adhesive may be specifically disposed based on requirements. Details are not described herein again.

When a structure of the side sealant is formed on the OLED screen, a vertical projection of the packaging cover plate on the bottom plate may be controlled to cover a vertical projection of the side sealant on the bottom plate. Specifically, in a possible implementation, the side sealant can be controlled to have a specific spacing from an edge of the packaging cover plate, to avoid interference between the packaging cover plate and the side plate in an assembly process that is caused when the side sealant exceeds beyond the edge of the packaging cover plate. In another possible implementation, an application amount of the side sealant may be controlled, so that the side sealant is aligned with a side edge of the packaging cover plate.

When the OLED display apparatus provided in this application is specifically disposed, to avoid interference between the packaging cover plate and the side plate during assembly, it may be specified that there is an avoidance gap between the packaging cover plate and the side plate along a direction in which the packaging cover plate points to the side plate.

According to a second aspect, this application provides a display terminal, including any OLED display apparatus provided in the technical solution of the first aspect. Specifically, because the OLED display apparatus in the display terminal provided in this application uses a side sealant, a seam sealant, and a transition connecting adhesive to perform waterproof sealing, a support structure corresponding to an OLED screen can be canceled on a side plate in a middle frame, so that sizes of black edges around the OLED screen can be effectively reduced, and overall beauty of the apparatus can be improved. In addition, the OLED display apparatus provided in this application performs waterproof sealing of the whole apparatus by using the side sealant, the seam sealant, and the transition connecting adhesive, so that waterproof performance of the whole apparatus can be ensured and improved.

According to a third aspect, this application provides a preparation method for an OLED display apparatus, including:

applying a side sealant to at least a side end surface that is of an OLED screen and that is located in a head area, so that the side sealant is adhered to a side end surface of a super clean foam, a side end surface of a display layer, and a surface that is of a portion in which a packaging cover plate exceeds beyond the display layer and that faces a bottom plate, to seal the side end surface of the OLED screen, where the super clean foam, the display layer, and the packaging cover plate are disposed in the OLED screen in a stacked manner;

applying an adhesive to the super clean foam or the bottom plate in a middle frame, so that the OLED screen is adhered to the bottom plate in the middle frame by using the adhesive; and connecting the middle frame and the OLED screen by using a seam sealant and a transition connecting adhesive, so that a side plate is adhered to the OLED screen by using the seam sealant in at least a support structure in a portion corresponding to a tail area, the transition connecting adhesive is disposed between the middle frame and the OLED screen in a portion corresponding to each corner in the head area, and the transition connecting adhesive connects the side sealant and the seam sealant, to implement overall sealing of the OLED display apparatus, thereby improving waterproof performance of the OLED display apparatus.

In a possible implementation, the method for connecting the middle frame and the OLED screen by using a transition connecting adhesive includes:

before filling the seam sealant, forming a first dam and a second dam by using a dam glue dispensing process, so that there is a gap between the second dam and the first dam, and the first dam can connect the side sealant, the seam sealant, and the adhesive, where the second dam is disposed on one side that is of the first dam and that is close to the tail area, and the second dam connects the seam sealant and the adhesive; and after filling the seam sealant, filling a dispensing glue in the gap through an opening disposed at a location of the bottom plate corresponding to the gap, so that the dispensing glue connects the side sealant, the first dam, the second dam, the adhesive, and the seam sealant.

DESCRIPTION OF EMBODIMENTS

Figure 1:
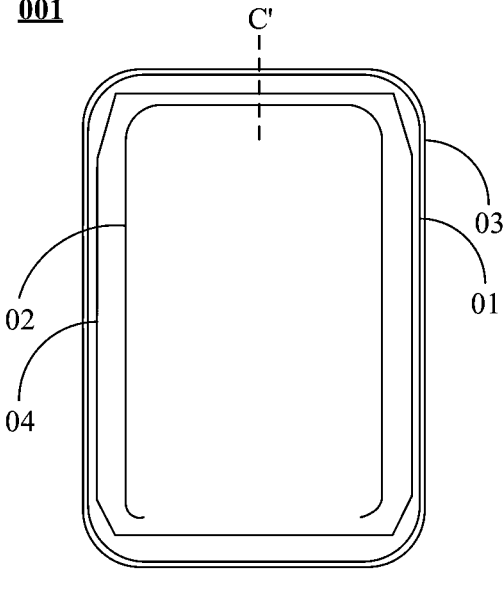
FIG. 1 is a diagram of a structure of an OLED display apparatus used in the conventional technology.

An OLED (organic light emitting diode, organic light emitting diode) display apparatus provided in embodiments of this application is applied to a common display terminal. An OLED display apparatus 001 currently used in the conventional technology is shown in FIG. 1. In the structure shown in FIG. 1, an OLED screen 01 is adhered to a middle frame 03 by using an adhesive 02, and a seam sealant 04 is dispensed around the middle frame 03 to be filled in a gap between the OLED screen 01 and the middle frame 03. In the OLED display apparatus 001, the adhesive 02 and the seam sealant 04 are used between the OLED screen 01 and the middle frame 03 to implement waterproof sealing.

Figure 2:
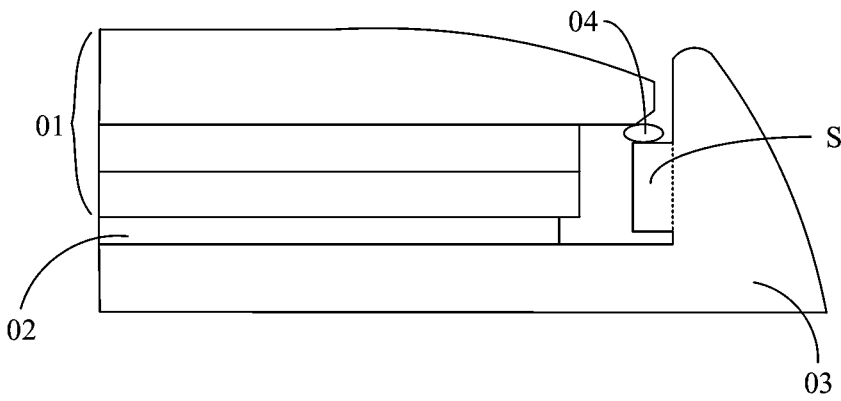
FIG. 2 is a sectional view of the OLED display apparatus in FIG. 1 at C'.

FIG. 2 is a sectional view at C' in FIG. 1. In the structure shown in FIG. 2, to dispense the seam sealant 04, a glue dispensing table S' of the seam sealant 04 needs to be designed on the middle frame 03 (schematically separated by dashed lines). The glue dispensing table S' causes a large width of a black edge of a head of the OLED screen 01, affecting a beauty effect of the whole apparatus. In addition, limited by a glue dispensing process capacity of the seam sealant 04, adhesive overflow easily occurs at a location of a glue dispensing table S of the middle frame 03.

In the structure shown in FIG. 1 and FIG. 2, when the OLED display apparatus 001 in the conventional technology ensures waterproof performance of the OLED screen, there are black edges around the OLED screen 01, which seriously affects beauty of the OLED display apparatus 001. Blindly reducing sizes of the black edges around the OLED screen 01 also causes poor sealing of the OLED screen 01. It should be noted that liquid entering of the OLED screen 01 causes serious failure of a function. Therefore, a waterproof design of the OLED screen is also very important.

In view of this, embodiments of this application provides an OLED display apparatus, to ensure waterproof sealing of an OLED screen while reducing sizes of black edges around the OLED screen.

The terms used in the following embodiments are merely intended for describing specific embodiments, but are not intended to limit this application. As used in the specification of this application and the appended claims, singular expressions "one", "a", "the", "the foregoing", and "this" are intended to also include, for example, an expression "one or more" unless expressly indicated to the contrary in the context.

References "one embodiment", "some embodiments", or the like described in this specification mean that a particular feature, structure, or characteristic described with reference to the embodiment is included in one or more embodiments of this application. Therefore, statements "in an embodiment," "in some embodiments", "in some other embodiments", and the like appeared in different places in this specification do not necessarily refer to a same embodiment, but mean "one or more but not all embodiments" unless otherwise specifically emphasized in another manner. The terms "include", "have", and variants thereof all mean "include but not limited to" unless otherwise specifically emphasized in another manner.

The following describes the technical solutions in embodiments of this application clearly and completely with reference to the accompanying drawings in embodiments of this application.

Figure 3:
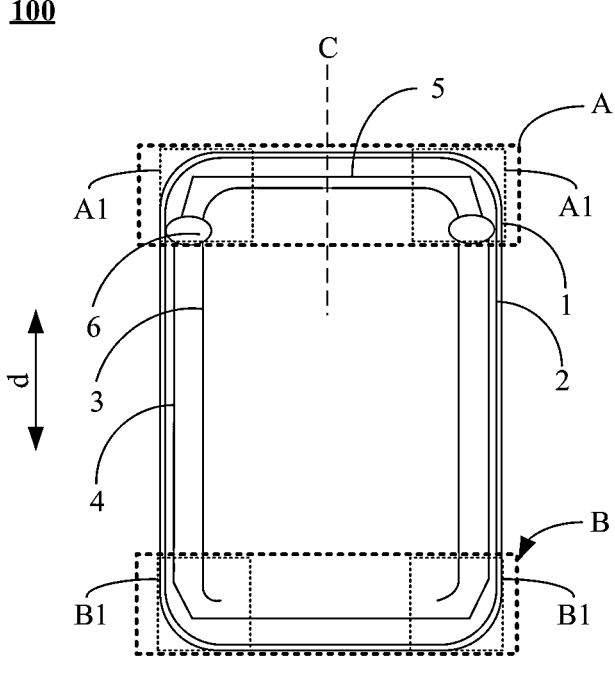
FIG. 3 is a diagram of a structure of an OLED display apparatus according to an embodiment of this application.

FIG. 3 is a diagram of a structure of an OLED display apparatus according to an embodiment of this application. It should be understood that the OLED display apparatus 100 in FIG. 3 is shown in a form of a mobile phone, but is not limited thereto. The OLED display apparatus may alternatively be another display terminal form such as a tablet, a notebook, or an intelligent wearable device. Specifically, in the structure shown in FIG. 3, the OLED display apparatus 100 provided in embodiments of this application includes a middle frame 1 and an OLED screen 2. As described herein, based on usage practice, the OLED display apparatus 100 may be divided into a head area A and a tail area B, and the head area A and the tail area B are arranged along a direction d. Due to features of the structure of the OLED display apparatus 100, the head area A has two corners A1, and the tail area B has two corners B1. Certainly, the head area A and the tail area B are not limited to portions shown in the figure, and are merely used as examples herein for description. Similarly, the corner A1 and the corner B1 are not limited to portions shown in the figure, and are merely used as examples herein for description.

Figure 4:
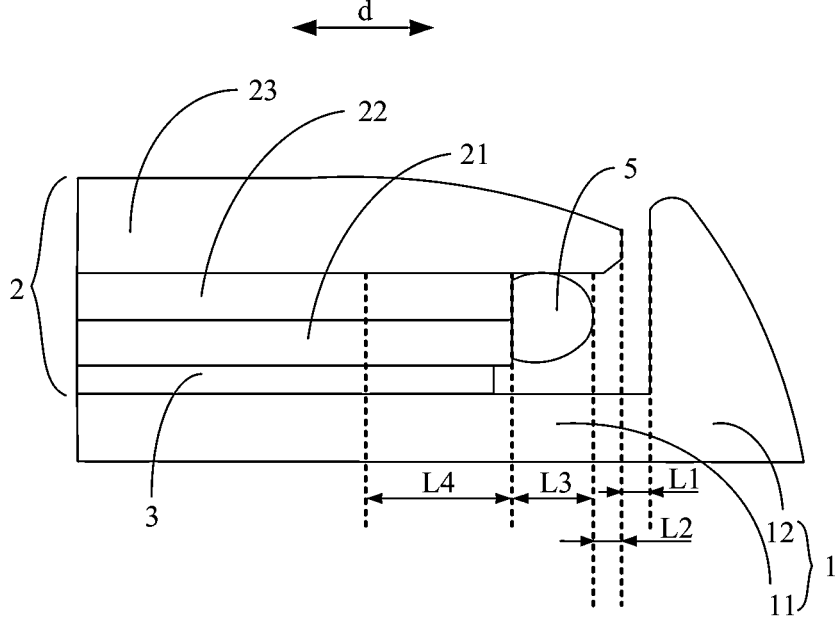
FIG. 4 is a sectional view of the OLED display apparatus in FIG. 3 at C.

FIG. 4 is a sectional view of the OLED display apparatus 100 in FIG. 3 at C. In the structure shown in FIG. 4, the middle frame 1 includes a bottom plate 11 and a side plate 12 located on a peripheral side of the bottom plate 11, and the middle frame 1 supports the OLED screen 2 through at least a support structure located in the tail area B. It should be understood that structures of the bottom plate 11 and the side plate 12 are schematically separated by dashed lines for clarity of illustration herein. The OLED screen 2 includes a super clean foam (super clean foam, SCF) 21, a display layer 22, and a packaging cover plate 23 that are disposed in a stacked manner. The packaging cover plate 23 partially extends beyond the display layer 22 and the super clean foam 21 along an extending direction of the OLED screen 2 to provide protection against the display layer 22 and the super clean foam 21. It should be understood that for example, the packaging cover plate 23 may be set as a glass cover plate. The display layer 22 may include a plurality of layers of optical film layers or several layers of display structures, which are not shown herein. The super clean foam 21 serves as a buffer for the OLED screen 2.

It should be noted that the OLED screen 2 in the OLED display apparatus 100 provided in this embodiment of this application may be a planar screen shown in FIG. 3. Certainly, the OLED screen 2 may alternatively be a curved screen. When the OLED screen 2 is the planar screen, the support structure on the middle frame 1 may be a glue dispensing table S' shown in the conventional technology. When the OLED screen 2 is the curved screen, the support structure on the middle frame may be a support point formed by other portions in the middle frame 1 in the OLED display apparatus 100.

With reference to the structure shown in FIG. 3, refer to FIG. 4. In the OLED display apparatus 100 provided in this embodiment of this application, the super clean foam 21 is adhered to the bottom plate 11 by using the adhesive 3, in other words, the OLED screen 2 is adhered to the middle frame 1 by using the adhesive 3. It should be noted that a waterproof sealing structure for implementing a waterproof sealing effect between the OLED screen 2 and the middle frame 1 is further disposed in the OLED display apparatus 100.

The waterproof sealing structure is specifically designed as follows: applying a seam sealant 4 on the support structure, and implementing waterproof sealing between the middle frame 1 and the OLED screen 2 by using the seam sealant 4; applying a side sealant 5 to a portion of the OLED screen 2 corresponding to the head area A, so that the super clean foam 21, a side end surface of the display layer 22, and a surface that is of the packaging cover plate 23 and that faces the bottom plate 11 are adhered and sealed by using the side sealant 5, and a side end surface of the OLED screen is sealed by using the side sealant 5; and forming a transition connecting adhesive 6 in each corner A1 in the head area A, so that the transition connecting adhesive 6 connects the seam sealant 4 and the side sealant 5.

The seam sealant 4, the side sealant 5, and the transition connecting adhesive 6 form a complete sealing structure on a peripheral side of the OLED screen 2, so that waterproof performance of the entire OLED display apparatus 100 can be improved. It should be noted that, because the OLED display apparatus 100 provided in this application uses the side sealant 5, the seam sealant 4, and the transition connecting adhesive 6 to perform waterproof sealing, and the support structure corresponding to the OLED screen 2 can be canceled on the side plate 12 in the middle frame 1, so that sizes of black edges around the OLED screen 2 can be effectively reduced, and overall beauty of the apparatus can be improved.

Certainly, the side sealant 5 in the OLED display apparatus 100 provided in this embodiment of this application is not limited to a location disposed in FIG. 3. The side sealant 5 may further extend to an area between the head area A and the tail area B when it is expected to reduce sizes of black edges between the head area A and the tail area B. Specifically, in a specific implementation, only one side of the side sealant 5 may extend to the area between the head area A and the tail area B. In another specific implementation, both sides of the side sealant 5 extends to the area between the head area A and the tail area B. A length of the side sealant 5 extending from the head area A can be set based on requirements. Details are not described herein.

To avoid interference between the packaging cover plate 23 and the side plate 12 in an assembly process, it may be specified that there is an avoidance gap between the packaging cover plate 23 and the side plate 12. In the structure shown in FIG. 4, a dimension of the avoidance gap between the packaging cover plate 23 and the side plate 12 in the direction d is L1. For example, L1 is 0.1 mm.

In addition, when the side sealant 5 is applied, the side sealant 5 can be controlled to have a specific spacing from an edge of the packaging cover plate 23, to avoid interference between the packaging cover plate 23 and the side plate 1 in an assembly process that is caused when the side sealant 5 exceeds beyond the edge of the packaging cover plate 23. For example, still refer to the structure shown in FIG. 4. A dimension of a spacing between the side sealant 5 and the edge of the packaging cover plate 23 along the direction d is L2. It should be noted that when the side sealant 5 is applied, a dimension of the side sealant 5 in the direction d may be set to L3 based on requirements.

It should be understood that a sum of the dimensions L2 and L3 is a dimension of the packaging cover plate 23 extending beyond the display layer 22 along the direction d. For example, L2 may be set to 0.25 mm, and L3 may be set to 0.35 mm. In this case, the dimension of the packaging cover plate 23 exceeding beyond the display layer 22 is 0.6 mm.

Figure 5:
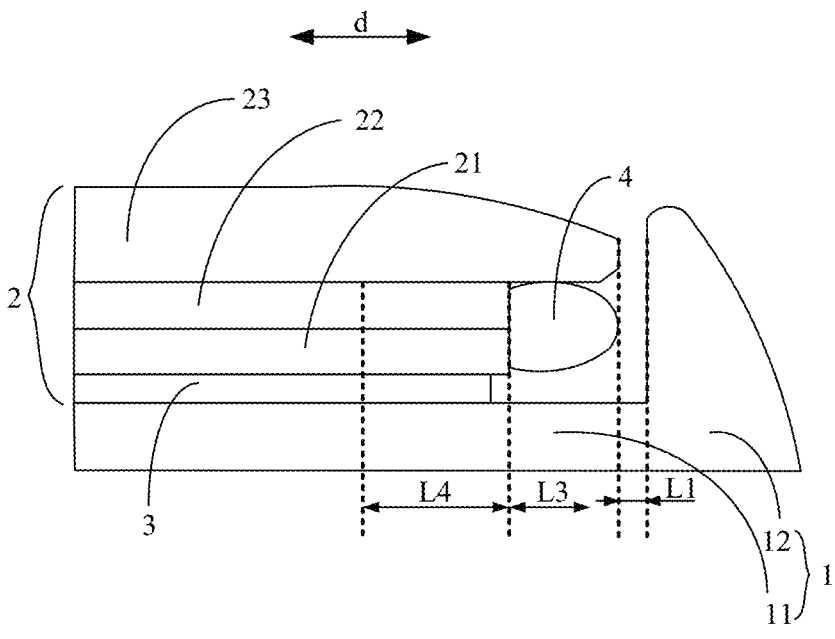
FIG. 5 is another sectional view of the OLED display apparatus in FIG. 3 at C.

Certainly, when the side sealant 5 is applied, an application amount of the side sealant 5 may also be controlled, so that the side sealant 5 is aligned with a side edge of the packaging cover plate 23. A value of L2 is set to 0. For details, refer to the structure shown in FIG. 5.

It should be noted that in addition to the portion in which the packaging cover plate 23 extends beyond the display layer 22 and the gap between the packaging cover plate 23 and the side plate 12, the black edges around the OLED screen 2 further include a non-display area in which the OLED screen 2 does not play a display role. Specifically, the OLED screen 2 includes a display area for displaying and the non-display area located on a peripheral side of the display area. In the structure shown in FIG. 5, the non-display area is a portion between the display area and an edge of the display layer 22 that are shown in L4.

In general, a total width of the black edges around the OLED screen 2 in the OLED display apparatus 100 provided in this application is equal to a sum of the dimensions L1, L2, L3, and L4. For example, when L1 is set to 0.1 mm, L2 is set to 0.25 mm, L3 is set to 0.35 mm, and L4 is set to 0.88 mm, the total width of the black sides around the OLED screen 2 in the OLED display apparatus 100 provided in this application is 1.58 mm. Compared with the conventional technology shown in FIG. 2 in which a total width of the black edges around the OLED display apparatus 001 is 2.08 mm, in this embodiment, the OLED display apparatus 100 provided in this application can effectively reduce the sizes of the black edges around the OLED screen 2, thereby improving overall beauty of the apparatus.

Figure 6:
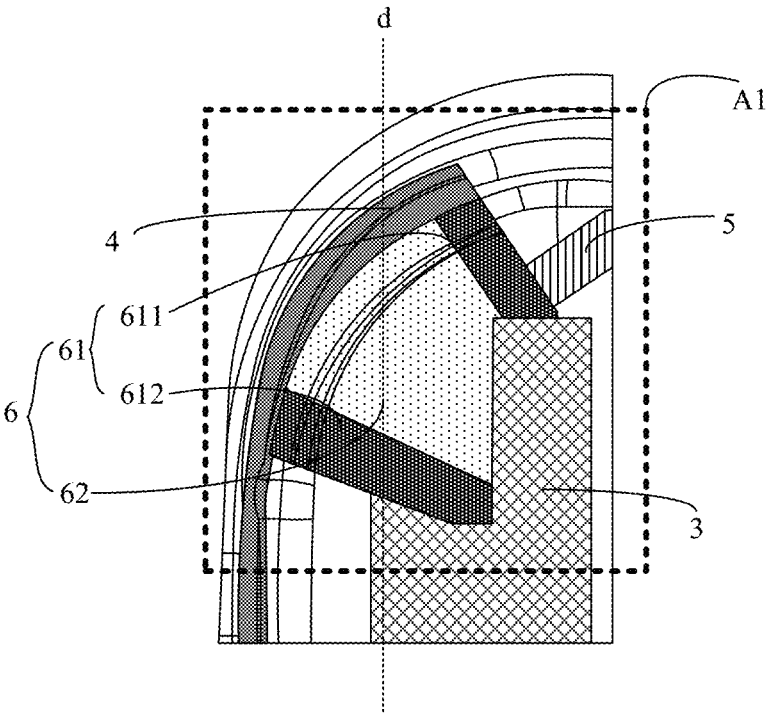
FIG. 6 is another schematic diagram of a structure of an OLED display apparatus according to an embodiment of this application.

FIG. 6 is a schematic diagram of a structure of an OLED display apparatus 100 obtained after an OLED screen 2 is removed according to an embodiment of this application. In the structure shown in FIG. 6, a corner A1 is used as an example. A transition connecting adhesive 6 includes a dam structure 61 and a dispensing glue 62 that are disposed in a corner A1. The dam structure 61 includes a first dam 611 and a second dam 612. There is a gap between the first dam 611 and the second dam 612. The dispensing glue 62 is filled in the gap. Specifically, the first dam 611 connects a side sealant 5, a seam sealant 4, and an adhesive 3. The second dam 612 is disposed on one side that is of the first dam 611 and that is away from the side sealant 5, and the second dam 612 connects the seam sealant 4 and the adhesive 2. It should be noted that the side sealant 5 may partially extend to the gap in which the dispensing glue 62 is filled, to improve waterproof sealing performance of the OLED display apparatus 100 provided in this embodiment of this application.

Certainly, when structures of transition connecting adhesives 6 in two corners A1 are specifically disposed, the structures of the transition connecting adhesives 6 in the two corners A1 may be set to be the same or similar. Similarly, disposing locations of the transition connecting adhesives 6 in the two corners A1 may be symmetrically disposed with respect to a central axis of the OLED screen 2 in the direction d. Alternatively, the transition connecting adhesives 6 in the two corners A1 may be approximately symmetrical or asymmetrical with respect to a central axis of the OLED screen 2 in the direction d based on requirements.

Figure 7:
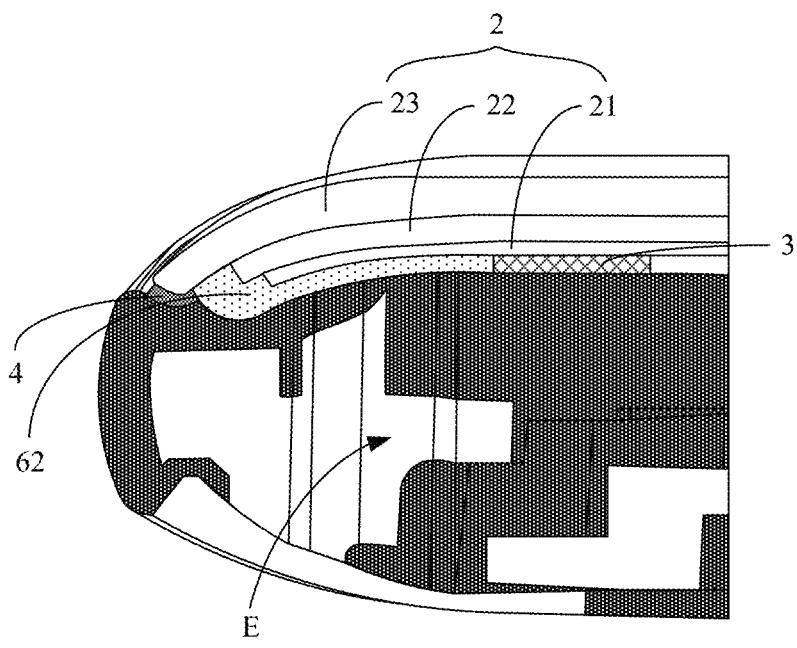
FIG. 7 is a sectional view of the structure in FIG. 6 along a direction d.

FIG. 7 is a sectional view of the structure in FIG. 6 along a direction d. In the structure shown in FIG. 7, the bottom plate 11 is provided, in a portion corresponding to the gap in which the dispensing glue 62 is filled, with a glue dispensing hole E for filling the dispensing glue 62.

Refer to the structure shown in FIG. 7 with reference to FIG. 6. This application further provides a preparation method for an OLED display apparatus, including:

applying a side sealant 5 to at least a side end surface that is of an OLED screen 2 and that is located in a head area A, so that the side sealant 5 is adhered to a side end surface of a super clean foam 21, a side end surface of a display layer 22, and a surface that is of a portion in which a packaging cover plate 23 exceeds beyond the display layer 22 and that faces a bottom plate 11, to seal the side end surface of the OLED screen 2, where the super clean foam 21, the display layer 22, and the packaging cover plate 23 are disposed in the OLED screen 2 in a stacked manner;

applying an adhesive 3 to the super clean foam 21 or the bottom plate 11 in a middle frame 1, so that the OLED screen 2 is adhered to the bottom plate 11 in the middle frame 1 by using the adhesive 3; and connecting the middle frame 1 and the OLED screen 2 by using a seam sealant 4 and a transition connecting adhesive 6, so that a side plate 12 is adhered to the OLED screen 2 by using the seam sealant 4 in at least a support structure in a portion corresponding to a tail area B, the transition connecting adhesive 6 is disposed between the middle frame 1 and the OLED screen 2 in a portion corresponding to each corner A1 in the head area A, and the transition connecting adhesive 6 connects the side sealant 5 and the seam sealant 4, to implement overall sealing of the OLED display apparatus 100, thereby improving waterproof performance of the OLED display apparatus 100.

A specific operation procedure of preparing the OLED display apparatus 100 provided in embodiments of this application is now provided, and is, for example, as follows:

A dam structure 61 is formed by applying dam glues at two sides of a glue dispensing hole E of a middle frame 1, to prevent adhesive overflow when the dispensing glue 62 is filled. A seam sealant 4 is dispensed in a portion outside a head area A in the middle frame 1.

Then, an OLED screen 2 whose head is dispensed with a side sealant 5 is assembled to the middle frame 1, so that a first dam 611 connects the side sealant 5, the seam sealant 4, and an adhesive 3. In addition, a second dam 612 connects the seam sealant 4 and the adhesive 2.

Finally, the dispensing glue 62 is formed by pouring glue into a back surface of the middle frame 1 through the glue dispensing hole E, and the dispensing glue 62 is effectively adhered to the seam sealant 5, the dam structure 61, and the adhesive 3 to form sealed waterproof sealing space, thereby improving waterproof sealing performance of the OLED display apparatus 100 provided in embodiments of this application.

The foregoing descriptions are merely specific implementations of this application, but the protection scope of this application is not limited thereto. Any change or replacement readily figured out by a person skilled in the art within the technical scope disclosed in this application shall fall within the protection scope of this application. Therefore, the protection scope of this application shall be subject to the protection scope of the claims.

What is claimed is:

1. An Organic Light-Emitting Diode (OLED) display apparatus, comprising:

a head area;

a tail area;

a middle frame; and an OLED screen, wherein the middle frame comprises a bottom plate and a side plate located on a side of the bottom plate;

the OLED screen comprises a super clean foam, a display layer, and a packaging cover plate that are disposed in a stacked manner; the super clean foam is adhered to the bottom plate by using an adhesive;

the packaging cover plate extends beyond the display layer along an extending direction of the OLED screen;

the OLED screen is provided with a side sealant at least in a portion corresponding to the head area, and the side sealant is adhered to a side end surface of the super clean foam, a side end surface of the display layer, and a side surface that is of the packaging cover plate and that faces the bottom plate;

the OLED screen is adhered to the middle frame by using a seam sealant outside the head area; and the OLED display apparatus has two corners in the head area, a transition connecting adhesive is disposed between the middle frame and the OLED screen at a location corresponding to each of the two corners, and the transition connecting adhesive connects the side sealant and the seam sealant.

2. The OLED display apparatus according to claim 1, wherein the transition connecting adhesive in at least one of the two corners comprises a dam structure and a dispensing glue, the dam structure comprises a first dam and a second dam, and there is a gap between the second dam and the first dam; the first dam connects the side sealant, the seam sealant, and the adhesive;

the second dam is disposed on one side that is of the first dam and that is close to the tail area, and the second dam connects the seam sealant and the adhesive; and the dispensing glue is filled in the gap.

3. The OLED display apparatus according to claim 2, wherein the bottom plate is provided, in a portion corresponding to the gap, with a glue dispensing hole for filling the dispensing glue.

4. The OLED display apparatus according to claim 1, wherein a vertical projection of the packaging cover plate on the bottom plate covers a vertical projection of the side sealant on the bottom plate.

5. The OLED display apparatus according to claim 4, wherein there is a spacing between the side sealant and an edge of the packaging cover plate along an extending direction of the packaging cover plate.

6. The OLED display apparatus according to claim 1, wherein there is an avoidance gap between the packaging cover plate and the side plate along a direction in which the packaging cover plate points to the side plate.

7. A display terminal, comprising an Organic Light-Emitting Diode (OLED) display apparatus, wherein the OLED display apparatus comprises:

a head area;

a tail area, a middle frame; and an OLED screen, wherein the middle frame comprises a bottom plate and a side plate located on a side of the bottom plate;

the OLED screen comprises a super clean foam, a display layer, and a packaging cover plate that are disposed in a stacked manner; the super clean foam is adhered to the bottom plate by using an adhesive;

the packaging cover plate extends beyond the display layer along an extending direction of the OLED screen;

the OLED screen is provided with a side sealant at least in a portion corresponding to the head area, and the side sealant is adhered to a side end surface of the super clean foam, a side end surface of the display layer, and a side surface that is of the packaging cover plate and that faces the bottom plate;

the OLED screen is adhered to the middle frame by using a seam sealant outside the head area; and the OLED display apparatus has two corners in the head area, a transition connecting adhesive is disposed between the middle frame and the OLED screen at a location corresponding to each of the two corners, and the transition connecting adhesive connects the side sealant and the seam sealant.

8. The display terminal according to claim 7, wherein the transition connecting adhesive in at least one of the two corners comprises a dam structure and a dispensing glue, the dam structure comprises a first dam and a second dam, and there is a gap between the second dam and the first dam; the first dam connects the side sealant, the seam sealant, and the adhesive;

the second dam is disposed on one side that is of the first dam and that is close to the tail area, and the second dam connects the seam sealant and the adhesive; and the dispensing glue is filled in the gap.

9. The display terminal according to claim 8, wherein the bottom plate is provided, in a portion corresponding to the gap, with a glue dispensing hole for filling the dispensing glue.

10. The display terminal according to claim 7, wherein a vertical projection of the packaging cover plate on the bottom plate covers a vertical projection of the side sealant on the bottom plate.

11. The display terminal according to claim 10, wherein there is a spacing between the side sealant and an edge of the packaging cover plate along an extending direction of the packaging cover plate.

12. The display terminal according to claim 7, wherein there is an avoidance gap between the packaging cover plate and the side plate along a direction in which the packaging cover plate points to the side plate.

* * * * *